(12) United States Patent
Lin

(10) Patent No.: US 11,646,726 B1
(45) Date of Patent: May 9, 2023

(54) ZERO-CROSSING DETECTOR CAPABLE OF SAVING POWER

(71) Applicant: Kuo-Tsun Lin, Taichung (TW)

(72) Inventor: Kuo-Tsun Lin, Taichung (TW)

( * ) Notice: Subject to any disclaimer, the term of this patent is extended or adjusted under 35 U.S.C. 154(b) by 82 days.

(21) Appl. No.: 17/450,952

(22) Filed: Oct. 14, 2021

(51) Int. Cl.
*G01R 19/175* (2006.01)
*H03K 5/1536* (2006.01)
*H02M 1/00* (2006.01)
*H02M 1/08* (2006.01)
*H02M 7/217* (2006.01)

(52) U.S. Cl.
CPC ......... *H03K 5/1536* (2013.01); *G01R 19/175* (2013.01); *H02M 1/0058* (2021.05); *H02M 1/083* (2013.01); *H02M 7/217* (2013.01)

(58) Field of Classification Search
CPC .. G01R 19/175; H02M 1/0058; H02M 1/083; H02M 7/217; H03K 5/1536
USPC ..................................................... 327/78, 79
See application file for complete search history.

(56) References Cited

U.S. PATENT DOCUMENTS

| 5,652,503 | A | 7/1997 | Urban et al. | |
| 9,730,303 | B1 * | 8/2017 | Lin | H05B 47/19 |
| 2014/0265897 | A1 | 9/2014 | Taipale et al. | |

FOREIGN PATENT DOCUMENTS

TW    201601594 A    1/2016

OTHER PUBLICATIONS

Office Action for Australian Application No. 2021250964 dated Sep. 28, 2022, 5 pages.
Search Report (with English translation) for Taiwanese Application No. 109111316 dated Sep. 3, 2020, 2 pages.

* cited by examiner

*Primary Examiner* — William Hernandez
(74) *Attorney, Agent, or Firm* — Lewis Roca Rothgerber Christie LLP

(57) ABSTRACT

A zero-crossing detector to be installed in a ceiling fan includes: a first terminal; a second terminal; and a rectifier, an adjustor and a feedback generator that cooperatively generate a current signal based on an AC voltage between the first and second terminals. The current signal has a non-zero magnitude when the AC voltage causes a potential at the first terminal to be greater than a potential at the second terminal, and has a zero magnitude when otherwise. An average of the non-zero magnitude of the current signal is greater when the adjustor is in a working state than when the adjustor is in a power saving state. The feedback generator generates a feedback signal based on the current signal.

8 Claims, 2 Drawing Sheets

ZERO-CROSSING DETECTOR CAPABLE OF SAVING POWER

FIELD

The disclosure relates to zero-crossing detection, and more particularly to a zero-crossing detector capable of saving power.

BACKGROUND

A conventional zero-crossing detector installed in a ceiling fan receives an alternating current (AC) voltage originating from the mains electricity for powering the ceiling fan, and generates a pulse signal, which indicates zero-crossing points of the AC voltage, for receipt by a control module of the ceiling fan. When the mains electricity is stably supplied to the ceiling fan, the ceiling fan can be turned on so that vanes of the ceiling fan start to rotate, and can be turned off so that the vanes stop rotating. When the ceiling fan is turned on, the control module controls the rotation of the vanes or light emission of lamps of the ceiling fan based on the pulse signal.

When the ceiling fan enters a sleep mode after being turned off fora while, the AC voltage is still supplied to the conventional zero-crossing detector, the conventional zero-crossing detector still generates the pulse signal, and the ceiling fan still consumes relatively high power. Therefore, the control module can learn a condition of the mains electricity based on the pulse signal, and can execute a power-off protection procedure upon loss of the mains electricity. If the supply of the AC voltage to the conventional zero-crossing detector is interrupted for the purpose of reducing the power consumption of the ceiling fan, the conventional zero-crossing detector would not operate to generate the pulse signal, and the control module would be unable to learn the condition of the mains electricity based on the pulse signal and would be unable to execute the power-off protection procedure upon loss of the mains electricity.

SUMMARY

Therefore, an object of the disclosure is to provide a zero-crossing detector that is capable of saving power.

According to the disclosure, the zero-crossing detector is to be installed in a ceiling fan including a control unit, and includes a first terminal, a second terminal, a rectifier, an adjustor and a feedback generator. The first and second terminals are to cooperatively receive an alternating current (AC) voltage. The rectifier, the adjustor and the feedback generator are coupled in series between the first and second terminals, cooperatively provide a current path between the first and second terminals, and cooperatively generate a current signal based on the AC voltage. The rectifier performs half-wave rectification so that the current signal has a non-zero magnitude and flows from the first terminal along the current path to the second terminal when the AC voltage causes a potential at the first terminal to be greater than a potential at the second terminal, and has a zero magnitude when otherwise. The adjustor is adapted to be further coupled to the control unit to receive a control signal, and switches between a working state and a power saving state based on the control signal to adjust the non-zero magnitude of the current signal. An average of the non-zero magnitude of the current signal is greater when the adjustor is in the working state than when the adjustor is in the power saving state. The feedback generator is adapted to be further coupled to the control unit, and generates a feedback signal for receipt by the control unit based on the current signal.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
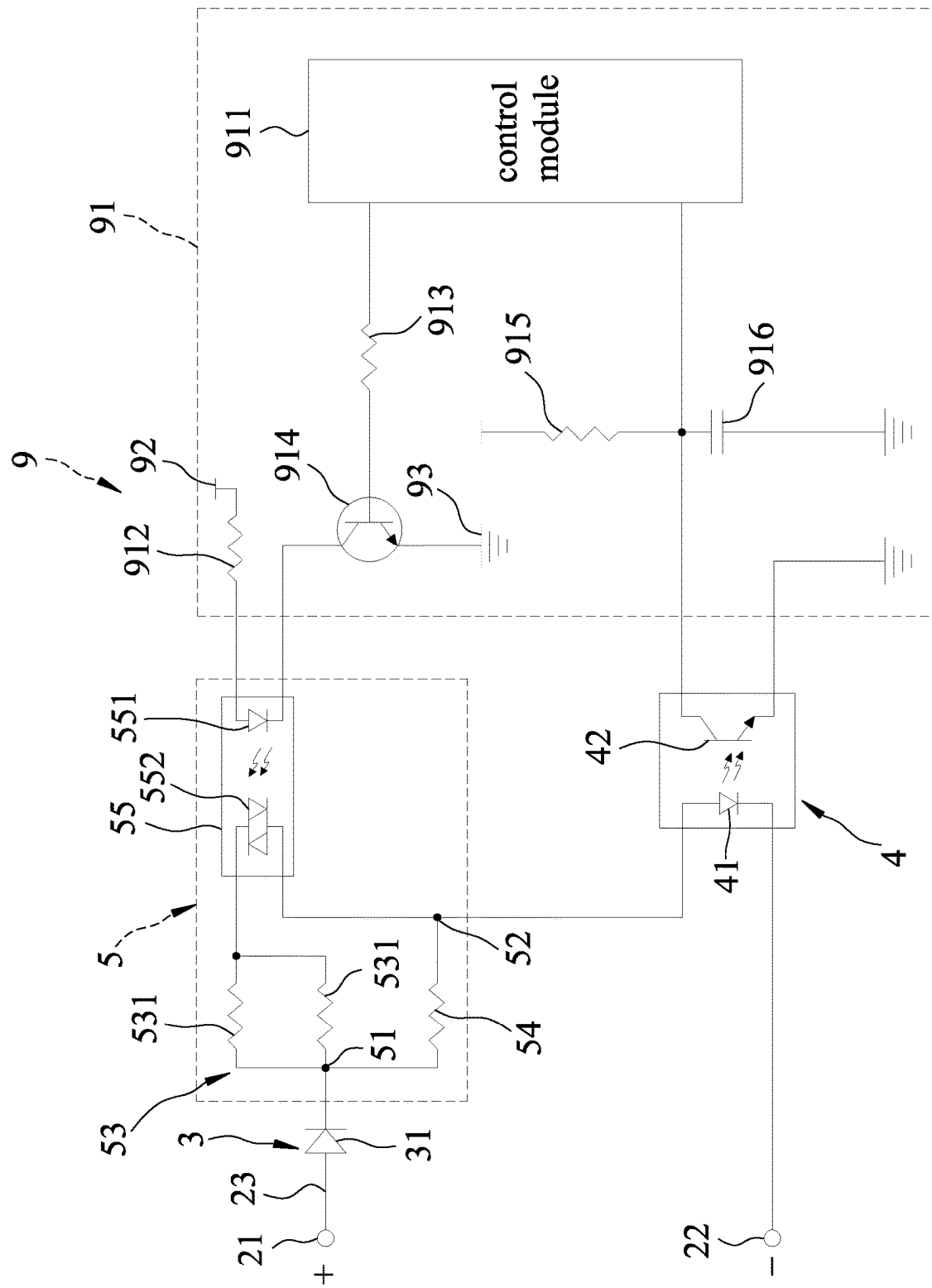
FIG. 1 is a circuit block diagram illustrating an embodiment of a zero-crossing detector according to the disclosure in use with a control unit of a ceiling fan.

Referring to FIG. 1, an embodiment of a zero-crossing detector according to the disclosure is to be installed in a ceiling fan 9. The ceiling fan 9 is powered by mains electricity, and includes at least a control unit 91. The control unit 91 outputs a control signal, and receives a feedback signal.

In this embodiment, the control unit 91 includes a control module 911 (e.g., a controller), three resistors 912, 913, 915, a switch 914 and a capacitor 916. The resistor 912 has a first terminal that is coupled to a power supply node 92, and a second terminal. The switch 914 (e.g., a bipolar junction transistor (BJT)) has a first terminal (e.g., a collector terminal), a second terminal (e.g., an emitter terminal) that is coupled to a ground node 93, and a control terminal (e.g., a base terminal). The resistor 913 is coupled between the control terminal of the switch 914 and the control module 911. The resistor 915 has a first terminal that is coupled to the power supply node 91, and a second terminal. The capacitor 916 is coupled between the second terminal of the resistor 915 and the ground node 93. A common node of the resistor 915 and the capacitor 916 is coupled to the control module 911.

It should be noted that the switch 914 is a BJT in this embodiment, but may be a metal oxide semiconductor field effect transistor (MOSFET), a relay or the like in other embodiments.

The zero-crossing detector of this embodiment includes a first terminal 21, a second terminal 22, a rectifier 3, an adjustor 5 and a feedback generator 4.

The first and second terminals 21, 22 are to cooperatively receive an alternating current (AC) voltage. The AC voltage may be supplied by the mains electricity, or may be obtained by an AC power module (not shown) of the ceiling fan 9 from processing (e.g., performing phase fired control on) a voltage supplied by the mains electricity.

The rectifier 3, the adjustor 5 and the feedback generator 4 are coupled in series between the first and second terminals 21, 22, cooperatively provide a current path 23 between the first and second terminals 21, 22, and cooperatively generate a current signal based on the AC voltage.

The rectifier 3 performs half-wave rectification so that the current signal has a non-zero magnitude and flows from the first terminal 21 along the current path 23 to the second terminal 22 when the AC voltage causes a potential at the first terminal 21 to be greater than a potential at the second terminal 22, and has a zero magnitude otherwise. In this embodiment, the rectifier 3 includes a diode 31 that is located on the current path 23, and that has an anode, which is coupled to the first terminal 21, and a cathode. It should be noted that, in other embodiments, the rectifier 3 may further include at least one resistor (not shown) that is located on the current path 23.

The adjustor 5 is adapted to be further coupled to the control unit 91 to receive the control signal, and switches between a working state and a power saving state based on the control signal, so as to adjust the non-zero magnitude of the current signal. An average of the non-zero magnitude of the current signal is greater when the adjustor 5 is in the working state than when the adjustor 5 is in the power saving state.

In this embodiment, the adjustor 5 includes two terminals 51, 52, a first resistive element 53, a second resistive element 54 and a switch 55. The terminals 51, 52 are located on the current path 23, and the terminal 51 is coupled to the cathode of the diode 31. The first resistive element 53 and the switch 55 are coupled in series between the terminals 51, 52. The switch 55 is adapted to be further coupled to the control unit 91 to receive the control signal, and switches between conduction and non-conduction based on the control signal. The second resistive element 54 is coupled between the terminals 51, 52. When the switch 55 conducts, the adjustor 5 is in the working state where the first resistive element 53 is coupled to the second resistive element 54 in parallel, the current signal flows from the terminal 51 through the parallel connection of the first and second resistive elements 53, 54 to the terminal 52, and a resistance provided by the adjustor 5 between the terminals 51, 52 is equal to an equivalent resistance of the parallel connection of the first and second resistive elements 53, 54. When the switch 55 does not conduct, the adjustor 5 is in the power saving state where the first resistive element 53 is not coupled to the second resistive element 54 in parallel, the current signal flows from the terminal 51 through only the second resistive element 54 to the terminal 52, and the resistance provided by the adjustor 5 between the terminals 51, 52 is equal to a resistance of the second resistive element 54. In other words, the resistance provided by the adjustor 5 between the terminals 51, 52 is greater when the adjustor 5 is in the power saving state than when the adjustor 5 is in the working state.

Optionally, the resistance of the second resistive element 54 is greater than a resistance of the first resistive element 53, so that the resistance provided by the adjustor 5 between the terminals 51, 52 is much greater when the adjustor 5 is in the power saving state than when the adjustor 5 is in the working state.

In this embodiment, the first resistive element 53 is implemented using two resistors 531 coupled in parallel, and the second resistive element 54 is implemented using a single resistor. However, the disclosure is not limited to such configuration. For example, in other embodiments, the first resistive element 53 may be implemented using a single resistor, two resistors coupled in series, or at least three resistors coupled in series and/or parallel.

In this embodiment, the switch 55 is an opto-isolator, and includes a transmitter 551 and a receiver 552. The transmitter 551 (e.g., a light emitting diode (LED)) has a first terminal (e.g., an anode) that is adapted to be coupled to the second terminal of the resistor 912, and a second terminal (e.g., a cathode) that is adapted to be coupled to the first terminal of the switch 914. The transmitter 51 is to receive the control signal from the control unit 91, and converts the control signal into a light signal. The receiver 552 (e.g., a phototriac) is coupled in series with the first resistive element 53 between the terminals 51, 52, is to receive the light signal generated by the transmitter 551, and switches between conduction and non-conduction based on the light signal.

It should be noted that, in other embodiments, the switch 55 may be a triac, a silicon controlled rectifier (SCR), a MOSFET or a BJT, and the circuit (including the elements 912-914) configured to control the switch 55 should be modified where necessary.

The feedback generator 4 is adapted to be further coupled to the control unit 91, and generates the feedback signal for receipt by the control unit 91 based on the current signal. In this embodiment, the feedback generator 4 is an opto-isolator, and includes a transmitter 41 and a receiver 42. The transmitter 41 (e.g., an LED) is located on the current path 23, has a first terminal (e.g., an anode) and a second terminal (e.g., a cathode) that are respectively coupled to the terminal 52 of the adjustor 5 and the second terminal 22, and converts the current signal into a light signal. The receiver 42 (e.g., a phototransistor) has a first terminal (e.g., a collector terminal) that is adapted to be coupled to the common node of the resistor 915 and the capacitor 916, and a second terminal (e.g., an emitter terminal) that is to be coupled to the ground node 93. The receiver 42 is to receive the light signal generated by the transmitter 41, and generates the feedback signal for receipt by the control unit 91 based on the light signal.

Figure 2:
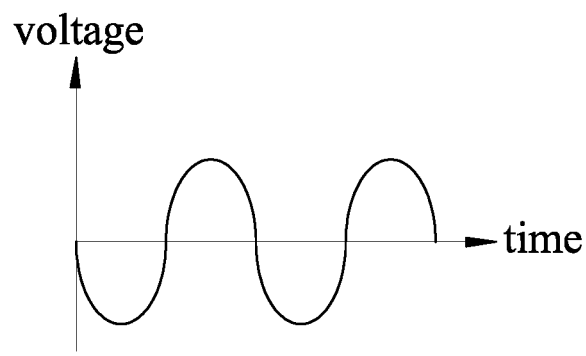
FIGS. 2 to 5 are timing diagrams illustrating operations of the embodiment.
Figure 3:
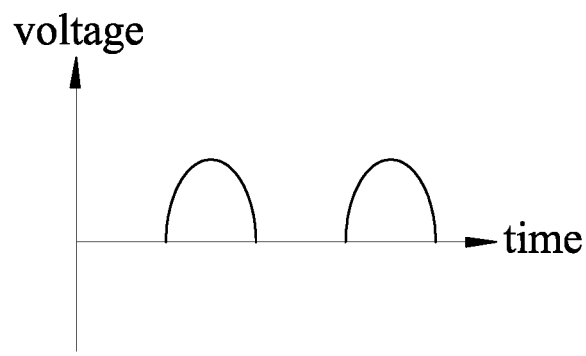
Figure 4:
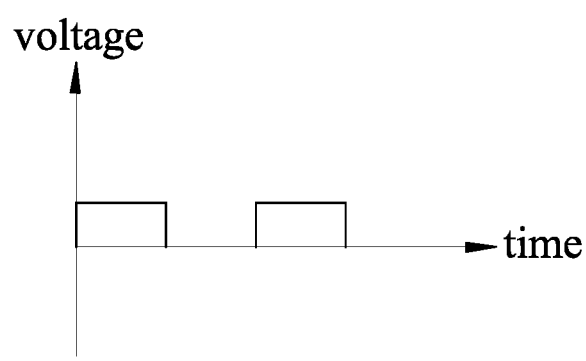
Figure 5:
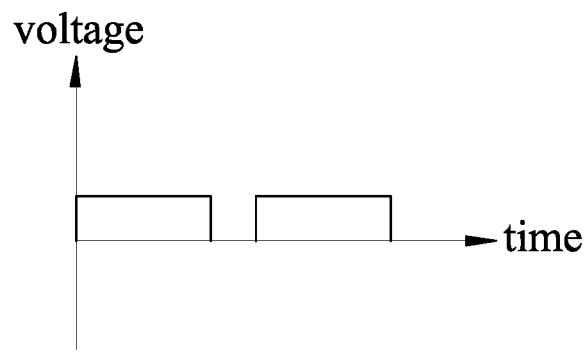

FIG. 2 illustrates the AC voltage. FIG. 3 illustrates a rectified voltage at the terminal 51 of the adjustor 5, a waveform of which is similar to a waveform of the current signal. FIG. 4 illustrates a pulse signal when the adjustor 5 is in the working state. FIG. 5 illustrates the pulse signal when the adjustor 5 is in the power saving state. The pulse signal is generated by the control unit 91 based on the feedback signal (e.g., being obtained by the control module 911 from binarizing a voltage across the capacitor 916).

Referring to FIGS. 1 to 5, operations of the zero-crossing detector of this embodiment are described in detail below.

When the ceiling fan 9 is turned on, the control module 911 causes the switch 93 to conduct, the control signal has a non-zero current magnitude, the light signal generated by the transmitter 551 of the switch 55 has a non-zero intensity, the receiver 552 of the switch 55 conducts (i.e., the adjustor 5 being in the working state), and the resistance provided by the adjustor 5 between the terminals 51, 52 is relatively small.

Because of the half-wave rectification performed by the rectifier 3, the rectified voltage as shown in FIG. 3 has a non-zero magnitude when the AC voltage causes the potential at the first terminal 21 to be greater than the potential at the second terminal 22 (e.g., in positive halves of the AC voltage as shown in FIG. 2), and has a zero magnitude when otherwise. In each negative half of the AC voltage, the current signal has a zero magnitude, the light signal generated by the transmitter 41 of the feedback generator 4 has a zero intensity, the feedback signal has a zero current magnitude, the voltage across the capacitor 916 is pulled up by the resistor 915 to be equal in magnitude to a power supply voltage at the power supply node 92, and the pulse signal as shown in FIG. 4 is in a logic "1" state. In each positive half of the AC voltage, since the resistance provided by the adjustor 5 between the terminals 51, 52 is relatively small, the current signal has a non-zero magnitude with a relatively large average, the light signal generated by the transmitter 41 of the feedback generator 4 has a non-zero intensity with a relatively large average, the feedback signal has a non-zero current magnitude with a relatively large average, the voltage across the capacitor 916 is quickly pulled down to be equal in magnitude to a ground voltage at the ground node 93, and switching of the pulse signal from the logic "1" state to a logic "0" state is substantially concurrent with a respective zero-crossing point of the AC voltage. Since the pulse signal accurately indicates the zero-crossing points of the AC voltage, the control module 911 can control operations of the ceiling fan 9 based on the pulse signal.

When the ceiling fan 9 enters a sleep mode after being turned off for a while, the control module 911 causes the switch 914 to not conduct, the control signal has a zero current magnitude, the light signal generated by the transmitter 551 of the switch 55 has a zero intensity, the receiver 552 of the switch 55 does not conduct (i.e., the adjustor 5 being in the power saving state), and the resistance provided by the adjustor 5 between the terminals 51, 52 is relatively large.

Because of the half-wave rectification performed by the rectifier 3, the rectified voltage as shown in FIG. 3 has a non-zero magnitude when the AC voltage causes the potential at the first terminal 21 to be greater than the potential at the second terminal 22 (i.e., in the positive halves of the AC voltage as shown in FIG. 2), and has a zero magnitude when otherwise. In each negative half of the AC voltage, the current signal has a zero magnitude, the light signal generated by the transmitter 41 of the feedback generator 4 has a zero magnitude, the feedback signal has a zero current magnitude, the voltage across the capacitor 916 is pulled up by the resistor 915 to be equal in magnitude to the power supply voltage, and the pulse signal as shown in FIG. 5 is in the logic "1" state. In each positive half of the AC voltage, since the resistance provided by the adjustor 5 between the terminals 51, 52 is relatively large, the current signal has a non-zero magnitude with a relatively small average, the light signal generated by the transmitter 41 of the feedback generator 4 has a non-zero intensity with a relatively small average, the feedback signal has a non-zero current magnitude with a relatively small average, the voltage across the capacitor 916 is slowly pulled down to be equal in magnitude to the ground voltage, and switching of the pulse signal from the logic "1" state to the logic "0" state considerably lags a respective zero-crossing point of the AC voltage.

Regardless of the state of the adjustor 5, the control module 911 can determine, based on the pulse signal, whether the AC voltage is stably supplied. The control module 911 determines that the AC voltage is stably supplied when the pulse signal switches between the logic "1" state and the logic "0" state, and determines that the supply of the AC voltage ceases when the pulse signal stays in the logic "1" state for more than a predetermined time.

When the supply of the AC voltage ceases because of loss of the mains electricity, the control module 911 can detect the loss of the mains electricity based on the pulse signal, and can execute a power-off protection procedure in a timely fashion. For example, the control module 911 is powered by electricity stored in capacitors (not shown) of the ceiling fan 9, and stores current settings of the ceiling fan 9. After the mains electricity is restored, the stored settings can be used to recover the ceiling fan 9 to a condition immediately prior to the loss of the mains electricity.

In view of the above, the zero-crossing detector of this embodiment has the following advantages.

1. By virtue of the adjustor 5 adjusting the non-zero magnitude of the current signal based on the control signal such that the average of the non-zero magnitude of the current signal is greater when the adjustor 5 is in the working state than when the adjustor 5 is in the power saving state, power consumption of the ceiling fan 9 can be reduced to achieve power saving once the ceiling fan 9 enters the sleep mode.

2. When the ceiling fan 9 is in the sleep mode, since the capacitor 916 is alternately discharged by the receiver 42 of the signal generator 4 and charged by the resistor 915, the pulse signal still switches between the logic "1" state and the logic "0" state, and the control module 911 can learn the condition of the AC voltage based on the pulse signal.

3. The configuration of the adjustor 5 is simple.

4. Since the resistance of the second resistive element 54 is greater than the resistance of the first resistive element 53, the resistance provided by the adjustor 5 between the terminals 51, 52 can be much greater when the adjustor 5 is in the power saving state than when the adjustor 5 is in the working state, thereby attaining better power saving effect.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that the disclosure is not limited to the disclosed embodiment but is intended to cover various arrangements included within the spirit and scope of the broadest interpretation so as to encompass all such modifications and equivalent arrangements.

What is claimed is:

1. A zero-crossing detector to be installed in a ceiling fan that includes a control unit, said zero-crossing detector comprising:

a first terminal and a second terminal that are to cooperatively receive an alternating current (AC) voltage; and a rectifier, an adjustor and a feedback generator that are coupled in series between said first and second terminals, that cooperatively provide a current path between said first and second terminals, and that cooperatively generate a current signal based on the AC voltage;

said rectifier performing half-wave rectification so that the current signal has a non-zero magnitude and flows from said first terminal along said current path to said second terminal when the AC voltage causes a potential at said first terminal to be greater than a potential at said second terminal, and has a zero magnitude when otherwise;

said adjustor being adapted to be further coupled to the control unit to receive a control signal, and switching between a working state and a power saving state based on the control signal to adjust the non-zero magnitude of the current signal, an average of the non-zero magnitude of the current signal being greater when said adjustor is in the working state than when said adjustor is in the power saving state;

said feedback generator being adapted to be further coupled to the control unit, and generating a feedback signal for receipt by the control unit based on the current signal.

2. The zero-crossing detector of claim 1, wherein:

said adjustor has two terminals that are located on said current path, and provides, between said two terminals of said adjustor, a resistance that is greater in the power saving state than in the working state.

3. The zero-crossing detector of claim 2, wherein said adjustor includes:

a first resistive element and a switch coupled in series between said two terminals of said adjustor, said switch being adapted to be further coupled to the control unit to receive the control signal, and switching between conduction and non-conduction based on the control signal; and a second resistive element coupled between said two terminals of said adjustor;

said adjustor being in the working state when said switch conducts, and being in the power saving state when said switch does not conduct.

4. The zero-crossing detector of claim 3, wherein said second resistive element has a resistance greater than that of said first resistive element.

5. The zero-crossing detector of claim 3, wherein said switch is one of an opto-isolator, a triac, a silicon controlled rectifier, a metal oxide semiconductor field effect transistor and a bipolar junction transistor.

6. The zero-crossing detector of claim 3, wherein:

said switch is an opto-isolator, and includes a transmitter and a receiver;

said transmitter is adapted to be coupled to the control unit to receive the control signal, and converts the control signal into a light signal; and said receiver is coupled in series with said first resistive element between said two terminals of said adjustor, is to receive the light signal, and switches between conduction and non-conduction based on the light signal.

7. The zero-crossing detector of claim 1, wherein said rectifier includes a diode that is located on said current path.

8. The zero-crossing detector of claim 1, wherein:

said feedback generator includes an opto-isolator;

said opto-isolator includes a transmitter and a receiver;

said transmitter is located on said current path, and converts the current signal into a light signal;

said receiver is adapted to be coupled to the control unit, is to receive the light signal, and generates the feedback signal for receipt by the control unit based on the light signal.

* * * * *